US011724932B2

(12) United States Patent
Pagani et al.

(10) Patent No.: US 11,724,932 B2
(45) Date of Patent: Aug. 15, 2023

(54) INTEGRATED MICRO-ELECTROMECHANICAL DEVICE OF SEMICONDUCTOR MATERIAL HAVING A DIAPHRAGM

(71) Applicant: STMicroelectronics S.r.l., Agrate Brianza (IT)

(72) Inventors: Alberto Pagani, Nova Milanese (IT); Alessandro Motta, Cassano d'Adda (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 475 days.

(21) Appl. No.: 16/442,199

(22) Filed: Jun. 14, 2019

(65) Prior Publication Data

US 2019/0292045 A1    Sep. 26, 2019

Related U.S. Application Data

(62) Division of application No. 14/856,707, filed on Sep. 17, 2015, now Pat. No. 10,364,143.

(30) Foreign Application Priority Data

Dec. 18, 2014   (IT) .......................... TO2014A001068

(51) Int. Cl.
*B81C 1/00*   (2006.01)
*B81B 7/00*   (2006.01)
(Continued)

(52) U.S. Cl.
CPC ........ *B81C 1/00158* (2013.01); *B81B 3/0021* (2013.01); *B81B 7/0074* (2013.01);
(Continued)

(58) Field of Classification Search
CPC ......... B81B 7/0074; B81B 2203/0127; B81B 2203/0315; B81B 3/0021; B81B 2201/0264; B81C 1/00158; G01L 9/0045
See application file for complete search history.

(56) References Cited

U.S. PATENT DOCUMENTS

| 6,116,863 A | 9/2000 | Ahn et al. |
| 7,504,007 B2 | 3/2009 | Bouche et al. |
| (Continued) | | |

FOREIGN PATENT DOCUMENTS

| EP | 1577656 B1 | 6/2010 |
| WO | 2009095170 A2 | 8/2009 |

OTHER PUBLICATIONS

Seki et al., "Pressure/Photo Sensor Utilizing Polymer Magnetic Composite," IEEE Transaction on Magnetics: vol. 29, No. 6, Nov. 1993, Abstract only.

*Primary Examiner* — Marcos D. Pizarro
(74) *Attorney, Agent, or Firm* — Slater Matsil, LLP

(57) ABSTRACT

A method for making an integrated micro-electromechanical device includes forming a first body of semiconductor material having a first face and a second face opposite the first face. The first body includes a buried cavity forming a diaphragm delimited between the buried cavity and the first face. The diaphragm is monolithic with the first body. The method further includes forming at least one first magnetic via extending between the second face and the buried cavity of the first body, forming a first magnetic region extending over the first face of the first body, and forming a first coil extending over the second face of the first body and being magnetically coupled to the first magnetic via.

20 Claims, 8 Drawing Sheets

(51) Int. Cl.
*B81B 3/00* (2006.01)
*G01L 9/00* (2006.01)

(52) U.S. Cl.
CPC .... *G01L 9/0045* (2013.01); *B81B 2201/0264* (2013.01); *B81B 2203/0127* (2013.01); *B81B 2203/0315* (2013.01); *B81C 2201/0116* (2013.01)

(56) References Cited

U.S. PATENT DOCUMENTS

| | | |
|---|---|---|
| 2004/0152228 A1 | 8/2004 | Benzel et al. |
| 2006/0082390 A1 | 4/2006 | Bouche et al. |
| 2006/0262088 A1 | 11/2006 | Baldo et al. |
| 2009/0316937 A1* | 12/2009 | Zheng .................. H04R 19/00 381/182 |
| 2010/0111726 A1 | 5/2010 | Fu et al. |
| 2012/0024389 A1 | 2/2012 | Renna et al. |
| 2013/0334621 A1 | 12/2013 | Classen et al. |

* cited by examiner

INTEGRATED MICRO-ELECTROMECHANICAL DEVICE OF SEMICONDUCTOR MATERIAL HAVING A DIAPHRAGM

CROSS-REFERENCE TO RELATED APPLICATIONS

This application is a divisional application of U.S. application Ser. No. 14/856,707 filed on Sep. 17, 2015, which claims priority to Italian Application No. TO2014A0001068 filed on Dec. 18, 2014, which both applications are hereby incorporated herein by reference.

TECHNICAL FIELD

The present invention relates to an integrated microelectromechanical device of semiconductor material having a diaphragm, such as a pressure sensor or an actuator.

BACKGROUND

Semiconductor manufacturing processes enable manufacturing of MEMS (Micro-Electro-Mechanical Systems) devices comprising suspended structures that are able to operate as transducers (i.e., to convert the movement of the suspended structure, due to external forces, into electrical signals) or as actuators (i.e., to generate a movement of the suspended structure starting from an electrical control signal).

In particular, in some applications, the suspended structures have a small thickness as compared to their area and are defined as diaphragms. Further, manufacturing processes are known providing the diaphragm in a monolithic silicon substrate above a buried cavity.

For example, European patent EP 1577656 describes a pressure sensor of a capacitive type in which the diaphragm is formed by providing, in a body of monocrystalline silicon, deep trenches separated by silicon columns. Then an epitaxial growth is carried out in a deoxidizing environment for causing growth, above the silicon columns, of an epitaxial layer that closes the trenches at the top. This traps the gas present therein. A thermal annealing treatment is carried out that causes migration of the silicon atoms and formation of a buried cavity delimiting at the top a suspended diaphragm. In the same patent, fabrication of a pressure sensor of a piezoresistive type is also described, including piezoresistive elements arranged on the periphery of the suspended diaphragm.

Various techniques are further known for forming MEMS components that include magnetic layers. For example, US 2012/0024389 describes an integrated electromagnetic actuator comprising a passive element of ferromagnetic material carried by a diaphragm, which is suspended over a cavity and is able to undergo bending. A coil and a magnetic core co-operate with the passive element for causing deflection of the diaphragm in a controlled way and displacement of a fluid contained in the cavity under the diaphragm. The diaphragm is typically formed as an adhesive film deposited above the cavity.

Known devices may be improved in regards to effectiveness, dimensions, manufacturing costs, and applicability.

SUMMARY

An object of the present invention is to provide an integrated semiconductor device having a mobile diaphragm that is able to overcome the drawbacks of the prior art.

According to the present invention, an integrated microelectro-mechanical device comprises a first body of semiconductor material having a first face and a second face opposite the first surface, with the first body including a buried cavity forming a diaphragm delimited between the buried cavity and the first face, and with the diaphragm being monolithic with the first body. At least one first magnetic via may extend between the second face and the buried cavity of the first body. A first magnetic region may extend over the first face of the first body. A first coil may extend over the second face of the first body and be magnetically coupled to the first magnetic via.

BRIEF DESCRIPTION OF THE DRAWINGS

For a better understanding of the present device preferred embodiments thereof are now described, purely by way of non-limiting examples, with reference to the attached drawings, wherein.

DETAILED DESCRIPTION OF ILLUSTRATIVE EMBODIMENTS

Figure 1:
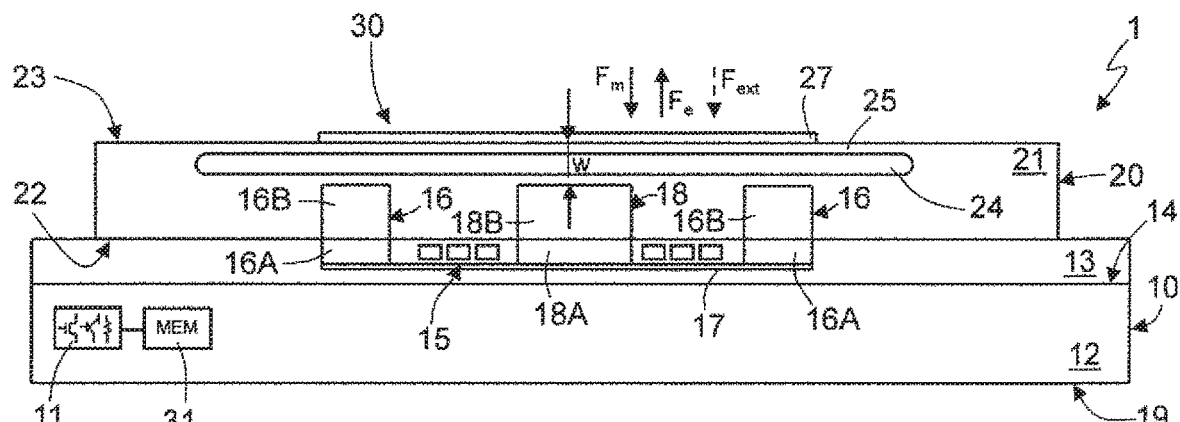
FIG. 1 shows a cross-section of an embodiment of the present integrated device.

FIG. 1 shows a first embodiment of a device 1, which is manufactured using the MEMS technology and may be used either as a sensor or as an actuator. The device 1 is formed by two parts: an electronic part and a mechanical part.

The device 1 comprises a first die 10, accommodating the electronic part, and a second die 20, accommodating the mechanical part. The dice 10, 20 are arranged on top of one another and are bonded in a known manner.

In detail, the first die 10 includes a first substrate 12, of semiconductor material, for example silicon, and a dielectric layer 13. A passivation layer (not shown for simplicity) may extend over the dielectric layer 13. The first substrate 12 has a first surface 14 and a second surface 19 and integrates an electronic signal-processing circuit, for example an ASIC (Application-Specific Integrated Circuit), including electronic components, designated as a whole by 11. The dielectric layer 13 extends over the first surface 14 of the first die 10 and embeds a coil 15 and bottom portions 16A, 18A of magnetic vias 16, 18. In the example of FIG. 1, a thin bottom magnetic region 17 (for example, an alloy of cobalt and/or nickel and/or iron, such as CoZrTa, FeHfN, and NiFe) extends within the dielectric layer 13 and is in direct contact with the magnetic vias 16, 18.

The second die 20 is formed by a second substrate 21, which is also of semiconductor material, for example silicon, and has a first surface 22 and a second surface 23. The second substrate 21 is fixed to the dielectric layer 13 with its first surface 22. The second substrate 21 houses a buried cavity 24, which extends in proximity of the second surface 23 and delimits, together with the latter, a diaphragm 25. The second die 20 further houses top portions 16B, 18B of the magnetic vias 16, 18 that traverse in part the second substrate 21. The bottom portions 16A, 18A and top portions 16B, 18B of the magnetic vias 16, 18 are congruent and aligned with one another.

Figure 2:
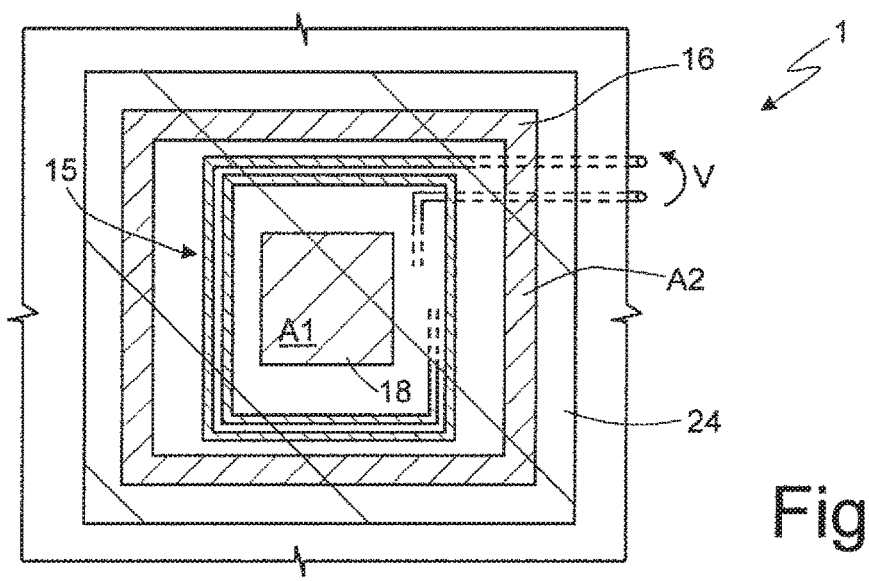
FIG. 2 is a ghost top plan view of the device of FIG. 1.

The arrangement of the coil 15, of the magnetic vias 16 and 18, and of the buried cavity 24 may be seen in FIG. 2. As may be noted, the magnetic via 16 has a tubular or toroidal shape, which, in the example shown, has a hollow square cross-section and surrounds at a distance the magnetic via 18, of a columnar or parallelepipedal shape, here with a full square cross-section. Consequently, the magnetic via 16 will also be referred to as an external magnetic via, and the magnetic via 18 will also be referred to as an internal magnetic via. The internal magnetic via 18 is arranged at the center with respect to the diaphragm 25. The coil 15 surrounds the internal magnetic via 18 and is in turn surrounded by the external magnetic via 16, concentric to the internal magnetic via 18. Also, the coil 15 has a square shape and is concentric to the magnetic vias 16, 18.

A top magnetic region 27 extends over the second surface 23 of the second die 20 and has, for example a thickness from 0.1 μm to 100 μm and beyond, more precisely from 1 μm to 10 μm, for example 1 μm. The bottom and top magnetic regions 17, 27 are here congruent, arranged on top of one another and have a substantially square shape, the sides whereof are aligned to the external sides of the external magnetic via 16. Consequently, in FIG. 2, these sides also represent the perimeter of the magnetic regions 17, 27.

FIG. 2 further shows, with dash lines, facing areas of the magnetic vias 16, 18 and the magnetic regions 17, 27. The facing areas are the transverse area A1 of the internal magnetic via 18 and the transverse area A2 of the external magnetic via 16, thus forming a total facing area A=A1+A2.

In the device 1, the bottom portions 16A, 18A of the magnetic vias 16, 18, the bottom magnetic region 17, and the coil 15 are formed in a final manufacturing step of the first die 10, at the wafer level. The coil 15 may be formed, for example, together with the interconnections of the electronic circuit 11, 31. In the second die 20, the buried cavity 24 is, for example, formed as described in EP 1577656 mentioned above. The top portions 16B, 18B of the magnetic vias 16, 18 are formed subsequently, by turning upside down the wafer prior to dicing, to obtain the second dice 20 and making the cavities that are to house the top portions 16B, 18B.

The magnetic regions 17, 27 and the magnetic vias 16, 18 are of ferromagnetic material. For example, the ferromagnetic material may be a soft ferromagnetic material, for instance, an alloy of cobalt and/or nickel and/or iron, such as CoZrTa, FeHfN, NiFe or a polymer with a filler of ferromagnetic particles, and may be formed by electroplating or sputtering.

After the wafers are diced to form the separate dice 10, 20, the latter are bonded together, for example, using process steps currently used to form the electrical connection between TSVs (through-silicon vias) and the contact pads. In this step, the portions 16A, 18A, 16B, 18B of the magnetic vias 16, 18, respectively in the first die 10 and in the second die 20, come into contact to form the magnetic vias 16, 18. In other implementations, the portions 16A, 18A, 16B, 18B of the magnetic vias 16, 18 may not be in contact with one another and have a gap between them.

The magnetic regions 17, 27 and the magnetic vias 16, 18 thus form a magnetic circuit 30, which enables detection of the movement of the diaphragm 25, for example, operating as a pressure sensor, when the device 1 is a sensor, or which enables control of the movement of the diaphragm 25, when the device 1 is an actuator.

In detail, when the device 1 operates as an actuator, the coil 15 is supplied with an excitation current I, which may be, for example, a d.c. or a.c. current or a more complex signal according to the applications. According to the laws of magnetism, the excitation current I generates a magnetic field that is confined in the magnetic circuit 30. In this way, in particular between the magnetic vias 16, 18 and the top magnetic region 27, a magnetic force $F_m$ of an attractive type is generated, which is proportional to the square of the excitation current I. It follows that acting on the diaphragm 25 are, to a first approximation, two forces. The magnetic force $F_m$ is generated by the magnetic circuit, which acts to move together the diaphragm 25 and the internal magnetic via 18. The elastic force $F_e$ is due to the elasticity of the silicon constituting the diaphragm, which operates as resistant force in the direction opposite to the former (the force of gravity is assumed as being negligible). In practice, a total force F:

$$F=F_m-F_e$$

acts on the diaphragm and may be controlled via the excitation current I for causing a desired displacement of the diaphragm 25.

In operation as an actuator, the memory element 31 may store the relationship between the desired actuation effect and the excitation current to be supplied to the coil 15. This is on the basis of information obtained during a device characterization.

In operation as an actuator, only the internal magnetic via 18 may be formed, since the attraction exerted by the latter on the top magnetic region 17 is sufficient. The presence of the external magnetic via 16 contributes, however, to actuation control, increasing the control efficiency and precision.

When the device 1 operates as a sensor, the coil 15 is supplied with a biasing current $I_b$ of a low value (for example, of a few microamps), such as not to cause any deflection of the diaphragm. Alternatively, the biasing current may cause a negligible deformation or in any case a limited deformation of the diaphragm 25 as compared to the deformation due to the quantity that is to be measured. In presence of an external force $F_{ext}$ to be measured (of a value such as to overcome the stiffness of the diaphragm 25), the latter bends, reaching an equilibrium position given, to a first approximation, by three forces. The three forces are the magnetic force $F_m$, of an attractive type, the elastic force $F_e$, of a resistant type, and the external force $F_{ext}$, generally oriented in the same direction as the magnetic force. At equilibrium, the total force F acting on the diaphragm 25 is zero:

$$F=F_m+F_{ext}-F_e=0,$$

so that $$F_{ext}=F_e-F_m.$$

Deflection of the diaphragm 25 causes a modification of the size of the gap w between the top magnetic region 27 and the internal magnetic via 18, thus causing a variation in the magnetic reluctance of the magnetic circuit 30 and thus in the voltage drop across the coil 15. Consequently, by measuring the variation of the voltage V across the coil 15 (FIG. 2) it is possible to determine the displacement of the diaphragm 25 and derive the external force $F_{ext}$. For example, during device characterization, it is possible to store a table that supplies the values of the force exerted on the diaphragm 25, for example, a pressure, as a function of different values of the voltage V. This table may, for example, be stored in a memory element 31 in the first die 10.

Modelling of the system shows that the device sensitivity effectively depends upon the absolute value of the gap w.

In fact, the reluctance R of the magnetic circuit 30 is given by:

$$R = \frac{W}{\mu_0 A}$$

where w, as said, is the gap, $\mu_o$ is the vacuum magnetic permeability, and A is the facing surface between the magnetic vias 16, 18 and the top magnetic region 27, as explained above with reference to FIG. 2.

On the other hand, the inductance L of a coil is given by:

$$L = \frac{N\Phi}{I} = \frac{N^2}{R}$$

where N is the number of turns of the coil 15, I is the biasing current, and Φ is the magnetic flux.

The infinitesimal variation of the inductance dL may thus be computed as follows:

$$dL = N^2 d\left(\frac{1}{R}\right) = N^2 \mu_0 A d\left(\frac{1}{w}\right) = -\frac{N^2 \mu_0 A}{w^2} dw.$$

Defining sensitivity S=dL/dw we obtain:

$$S = \frac{dL}{dw} = -\frac{N^2 \mu_0 A}{w^2}.$$

For example, in an ideal device with A=400×400 µm², N=10, w=10 µm, with $\mu_o=4\pi \cdot 10^{-7}$, we obtain an inductance L=2 µH and a variation dL[nH]≈−200·dw[µm].

Figure 3:
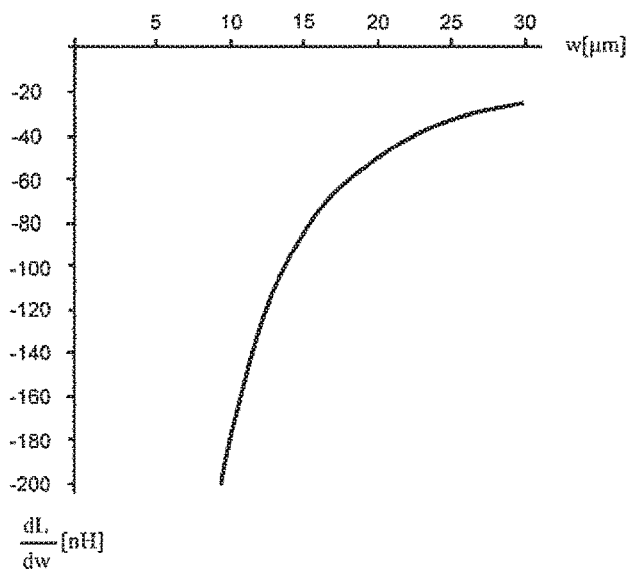
FIG. 3 shows the plot of the sensitivity of an ideal device as a function of a parameter.

In this case, the plot sensitivity S versus gap w is as shown in FIG. 3. As may be noted, the sensitivity S depends upon the absolute value of the gap w and is inversely proportional thereto. In particular, the absolute value of the sensitivity S decreases as the size of the gap w increases. Consequently, the maximum sensitivity may be obtained with small gaps and is very high in case of the integrated semiconductor device, where it is possible to obtain gaps w of a few micrometres.

The device 1 of FIG. 1 has the following advantages:

formation of the cavity 15 as a buried cavity in a monolithic silicon substrate (second substrate 21) enables the diaphragm 25 to be manufactured monolithically with the second substrate 21, with high accuracy, repeatability, reliability, process control, and high performance;

integration in silicon dice having dimensions typical of electronic circuits enables high compactness, and thus ample possibilities of use of the device in apparatus and housings of small dimensions;

manufacturing does not require particular arrangements; for example, since the magnetic circuit does not require electrical continuity, problems of tolerances or design that prevent contact between the magnetic vias 16, 18 and the first magnetic region 17 do not entail operation problems;

the possibilities of forming gaps as small as a few micrometres enables manufacture of sensors with high sensitivity and actuators with high performance;

the device may have the desired dimensions according to the operating modes and to the application, with high scaling possibilities; and in operation as a sensor, the consumption is reduced to very low values and thus the device may be used in low-power applications.

In a variation (not shown) of the device 10 of FIGS. 1 and 2, the first magnetic region 17 may be missing. In this case, the magnetic vias 16, 18 may extend only within the second substrate 21, ending on the first surface 22 of the latter. In this way, the dielectric layer 13 does not accommodate parts of ferromagnetic material, which, instead, are housed just in the second die 20, which contains only mechanical elements. In this way, the first die 10, which integrates the electronic components, is not affected by manufacturing steps that use ferromagnetic materials, which require particular arrangements to prevent any contaminations. Consequently, the manufacturing process is simpler and more economically advantageous, and also the reliability of the device and the process yield increase.

Figure 4:
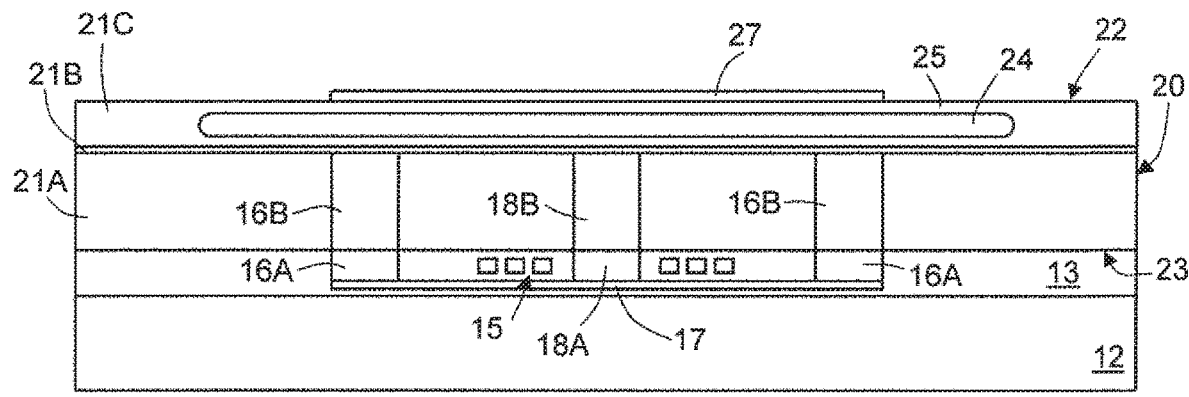
FIGS. 4-6 show cross-sections of other embodiments of the present integrated device.

FIG. 4 shows an embodiment where the second substrate 21 is of an SOI (Silicon-On-Insulator) type and is formed by a first semiconductor layer 21A, for example, of monocrystalline silicon, by an insulating layer 21B, for example of silicon oxide, and by a second semiconductor layer 21C, for example of monocrystalline silicon. The buried cavity 24 and the diaphragm 25 are formed in the second semiconductor layer 21C. Thereby, process control characteristics, repeatability, and performance improve. In addition, the insulating layer 21B forms a stopper during the etching step for forming the top portions 16B, 18B of the magnetic vias 16, 18.

Figure 5:
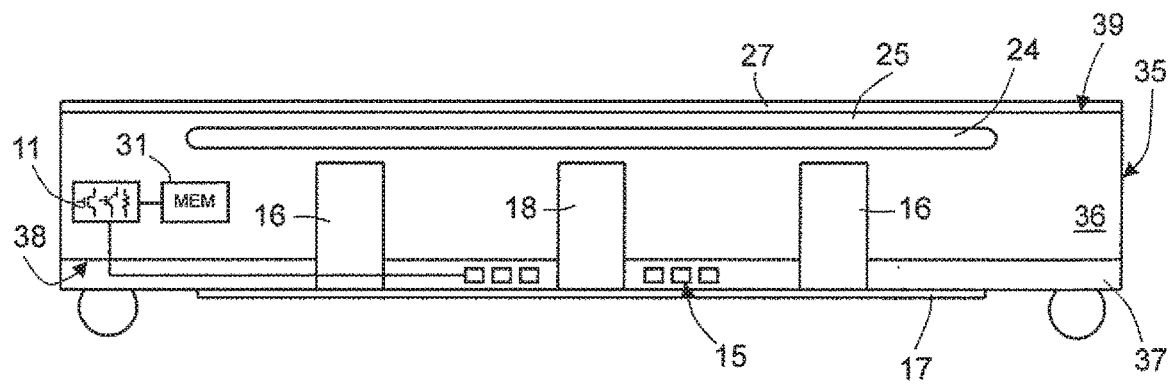

FIG. 5 shows an embodiment including a single die 35, comprising a substrate 36 and an insulating layer 37. The substrate 36 houses the electrical components 11 and possibly the memory 31 and has a first surface 38 and a second surface 39. The insulating layer 37 extends over the first surface 38 of the substrate 36 and houses the coil 15. The first magnetic region 17 is formed on the free surface of the insulating layer 37. The buried cavity 24 extends in proximity of the second surface 39 of the substrate 36, and the top magnetic region 27 extends over the second surface 39. The top magnetic region 27 extends over the entire surface 39, thus simplifying the production process and reducing the costs.

The magnetic vias 16, 18 are monolithic and may be formed in a final process step by forming trenches that traverse the insulating layer 37 and extend in depth into the substrate 36.

Figure 6:
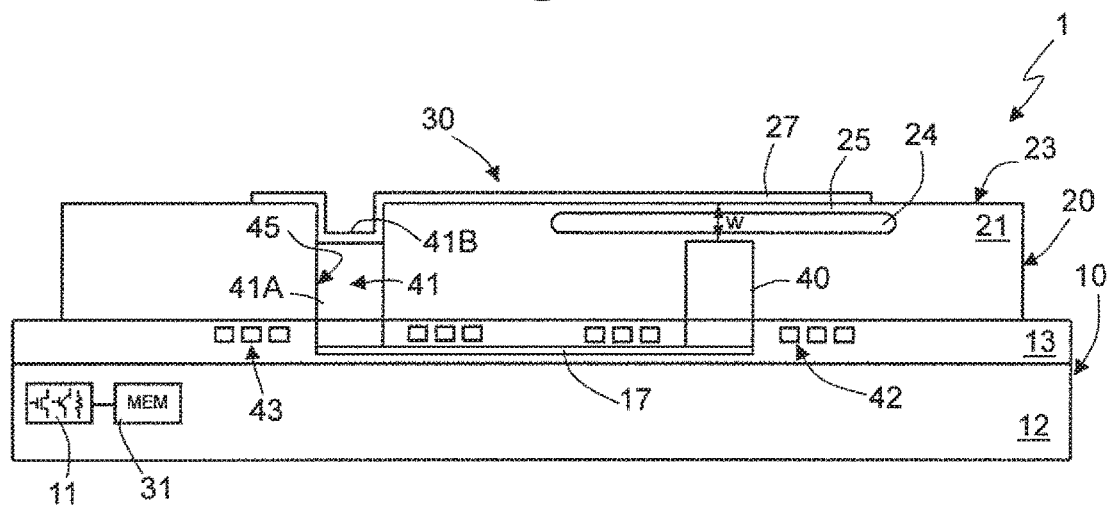
Figure 7:
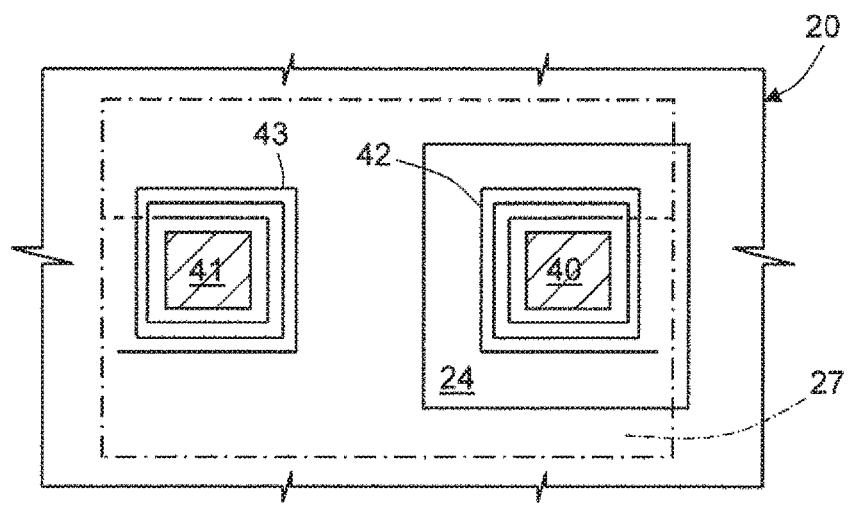
FIG. 7 is a see-through top plan view of the device of FIG. 6.

The structure of FIG. 5 is thus characterized by a particularly small thickness. FIGS. 6 and 7 show an embodiment with two coils that have distinct biasing and sensing functions.

In detail, the magnetic circuit 30 comprises a first magnetic via 40 and a second magnetic via 41, of a columnar shape. The first magnetic via 40 extends in part in the second substrate 21 and in part in the dielectric layer 13, as in FIG. 1, and is arranged at the center underneath the buried cavity 24 and thus the diaphragm 25. The second magnetic via 41 is arranged laterally with respect to the diaphragm 25 and extends in a through trench or hole 45 completely traversing the second substrate 21. In an embodiment, the second magnetic via 41 may be formed by a first portion 41A formed simultaneously with and in the same way as the magnetic via 40, and by a second portion 41B formed as a continuation of the first portion 41A. In particular, the second portion 41B is formed via an appropriate etching process and then filled at least in part with magnetic material during the deposition of the material of the top magnetic region 27. In a variation not shown, it is possible to have a gap between the portions 41A and 41B of the magnetic via 41. The second magnetic via 41 thus extends for most of the thickness of the second substrate 21 (but could extend throughout the thickness thereof) and in part in the dielectric layer 13. The first magnetic via 40 is surrounded by a first coil 42, and the second magnetic via 41 is surrounded by a second coil 43. The coils 42 and 43 are formed in the dielectric layer 13 and form, respectively, a measuring or sensing coil and a biasing/excitation coil. It is in any case possible to swap around the functions of excitation and measurement between the two coils 42 and 43.

As in FIG. 1, the first magnetic region 17 extends in the dielectric layer 13 and is in direct contact with the magnetic vias 40, 41. The top magnetic region 27 extends over the second surface 23 of the second substrate 21 and in part in the through trench 45 to be in direct contact with the second magnetic via 41.

In this way, as may be noted in the cross-section of FIG. 6, the magnetic circuit 30, including the first magnetic via 40, the first magnetic region 17, the second magnetic via 41, and the top magnetic region 27, has a toroidal shape open at the gap w. The coils 42, 43 form a transformer, with the flux generated by the second coil 43 being concatenated with the first coil 42.

With this configuration, the magnetic power associated to the second coil 43 is transmitted to the first coil 42 with a transmission coefficient that depends upon the gap w. The measurement of the current flowing in the first coil 42 and/or of the voltage across it thus enables detection of the gap width. This approach may thus be appropriately used as force or movement sensor. By supplying an appropriate current to the second coil 43 it is possible to control the gap w and modify the sensitivity of the sensor.

Alternatively, the device may operate as an actuator, for example as a speaker, supplying an appropriate current also to the first coil 42. In this case, it is possible to increase or reduce the gap w, and consequently the portion of the surface 23 of the second die 20 in proximity of the cavity 24 may assume a concave or convex shape. In this operating mode, it is possible to omit the bottom magnetic region 17 so that the coils 42 and 43 are independent.

In FIG. 6, the top magnetic region 27 extends over the entire part of the surface 23 overlying the cavity 24 and beyond, but embodiments (not shown) are possible wherein the top magnetic region 27 extends only in part above the cavity 24.

According to another alternative, in the embodiment of FIGS. 6 and 7, the first coil 42 may be omitted. In this case, the second coil 43 operates both as a biasing (or excitation) coil and as a measuring coil.

Figure 8:
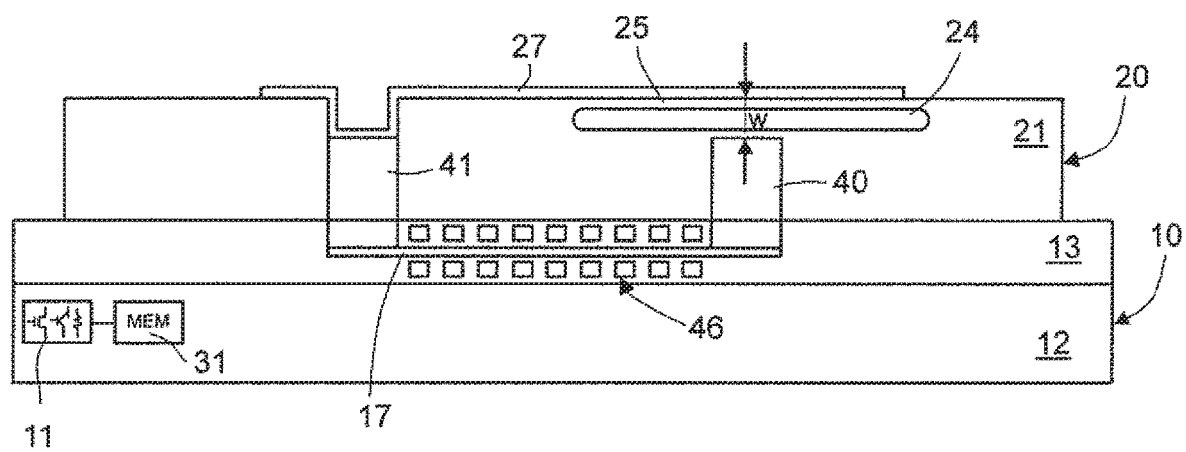
FIGS. 8 and 9 show cross-sections of other embodiments of the present integrated device.

FIG. 8 shows an embodiment having the general structure shown in FIGS. 6 and 7, with a single coil 46 of a solenoid shape wound round the first magnetic region 17. Also, the coil 46 is formed within the dielectric layer 13.

In this way, the coil 46 is at a uniform distance from the first magnetic region 17 and minimizes the dispersed flux. A greater efficiency is thus obtained.

Figure 9:
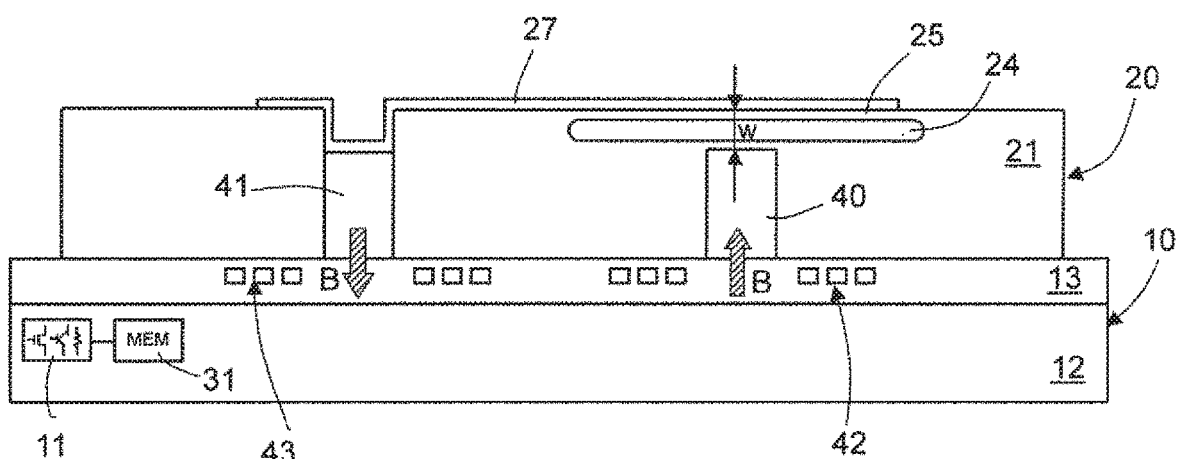
Figure 10:
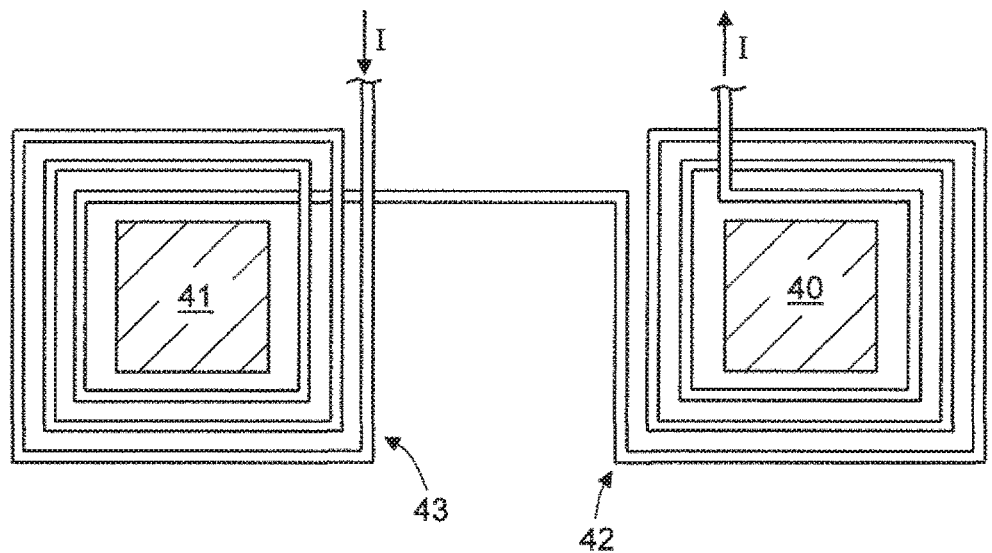
FIG. 10 is a top plan view of a detail of the device of FIG. 9.

FIGS. 9 and 10 show an embodiment which has the general structure shown in FIGS. 6 and 7 (columnar shape) and in which the first magnetic region 17 is absent. Further, the coils 42 and 43 are connected together in series and are wound in opposite directions to be traversed by the same excitation/biasing current I but in opposite directions. For example, FIG. 10 shows a current I that enters the second coil 43 from an external end thereof, flows along the latter in a clockwise direction, enters the first coil 42 from an external end thereof, and flows along the latter in a counterclockwise direction (anti-series or opposing configuration). In this situation, the magnetic fields generated by the coils 42, 43 are oriented in opposite directions, as indicated by the arrows in FIG. 9. A push-pull effect is thus obtained that enables a high efficiency to be achieved, even in the absence of the bottom magnetic region 17 that closes the magnetic circuit 30.

Figure 11:
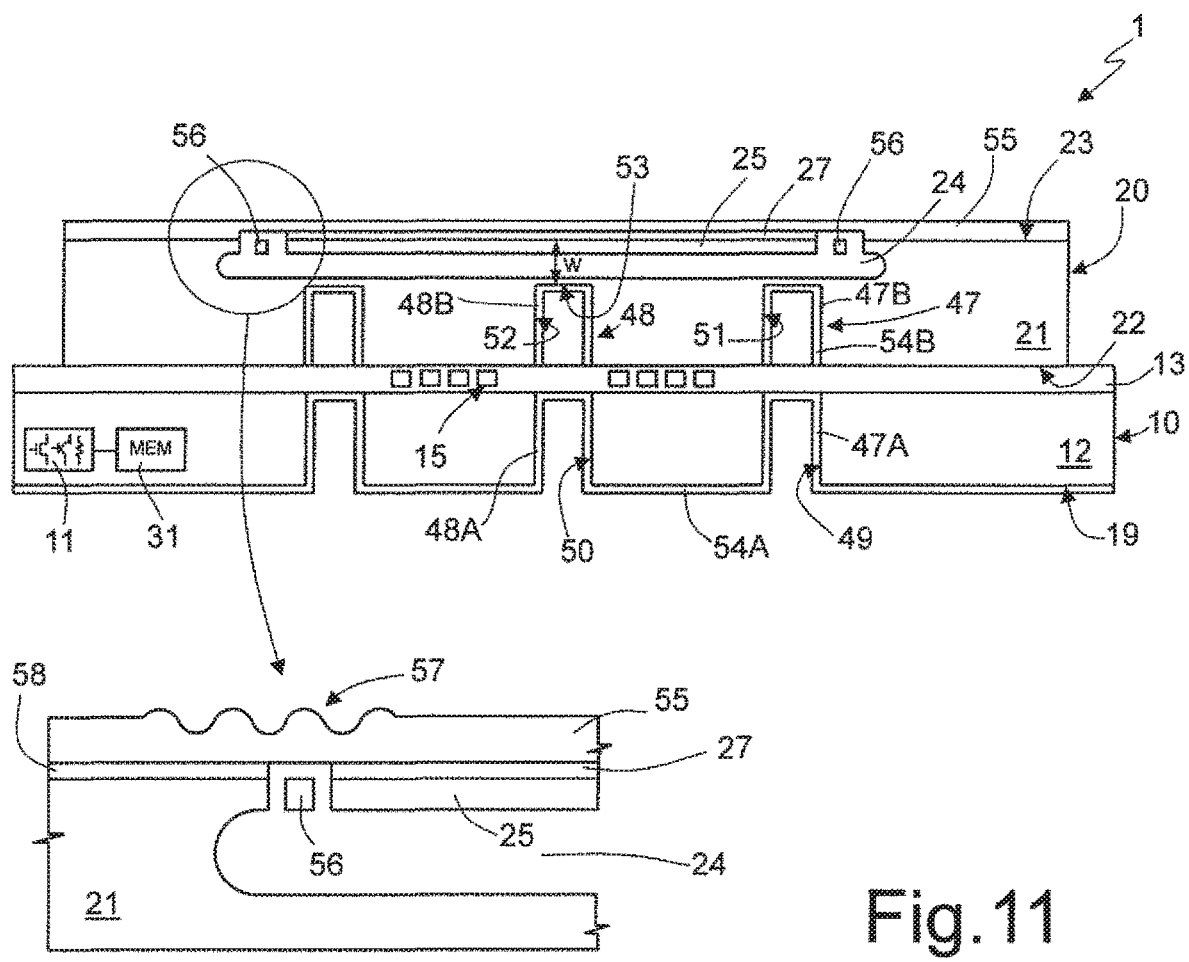
FIG. 11 shows a cross-section of another embodiment of the present integrated device.
Figure 12:
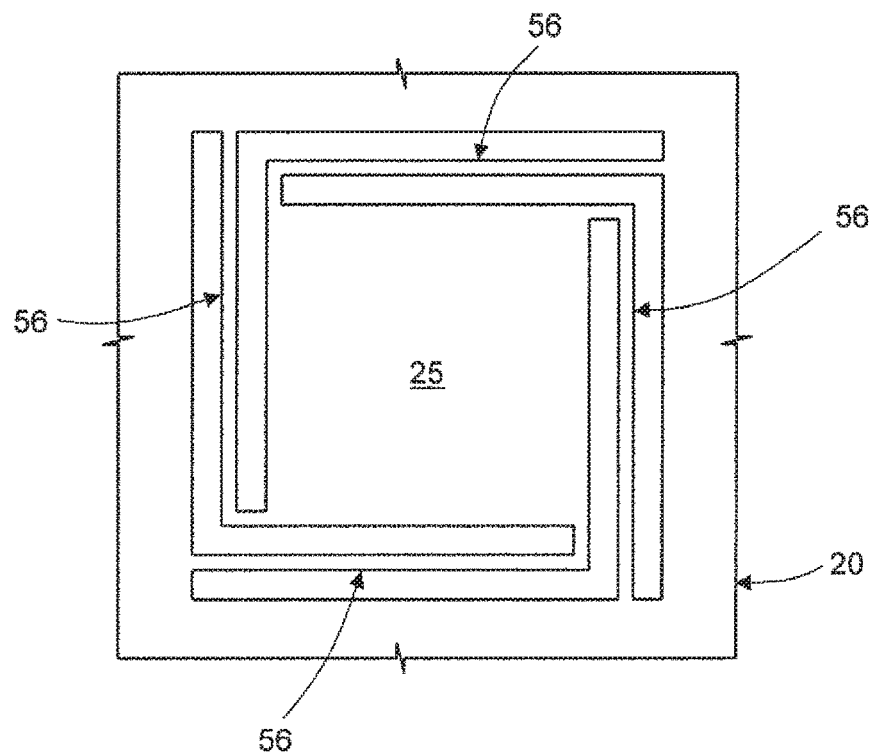
FIG. 12 is a top plan view of a detail of the device of FIG. 11.

FIGS. 11 and 12 show an embodiment wherein the magnetic vias, designated by 47, 48, are neither full nor continuous. In detail, in the device 1 of FIG. 11, the first substrate 12 of the first die 10 has through trenches/holes 49, 50, and the second substrate 21 of the second die 20 has blind trenches/holes 51, 52, which extend from the first surface 22 of the second die 20 up to in proximity of the buried cavity 24. The trenches 49 and 51 (hereinafter also defined as external trenches) have a toroidal shape and are vertically aligned to one another. The trenches/holes 50 and 52 (hereinafter also defined as internal trenches) have a cylindrical or parallelepipedal shape, are vertically aligned with one another, and are surrounded by the trenches 49, 51. Also here, the distance between the bottom 53 of the internal blind trench 52 and the top magnetic region 27 defines the gap w.

A first thin ferromagnetic layer 54A, having for example, a thickness comprised between 0.1 μm and 100 μm and beyond, more precisely between 1 μm and 10 μm, for example 1 μm, coats the walls and the bottom of the through trenches 49, 50 and the second surface 15 of the first substrate 12, forming the bottom part 47A, 48A of the magnetic vias 47, 48. A second thin ferromagnetic layer 54B coats the walls and the bottom of the blind trenches 51, 52 in the second substrate 21, to form the top part 47B, 48B of the magnetic vias 47, 48.

The through trenches 49, 50 in the first substrate 12 do not extend into the dielectric layer 13 so that the magnetic vias 47, 48 are not continuous. Alternatively, the through trenches 49, 50 may extend also through the dielectric layer 13 for forming continuous through trenches and vias between the first and second dice 10, 20. The trenches 49, 50 in the first substrate 12 and the first thin ferromagnetic layer 54A may be formed after integrating the electrical components 11 and 31 in the first substrate 12 and forming the coil 15 and possible interconnections in the dielectric layer 13, by turning the die upside down and etching it from the back.

An insulating layer 55, for example, a dielectric layer such as a polymer layer, extends over the second surface 23 of the second die 20. The layer 55 may also be a previously formed layer that is bonded on the second surface 23 or may be missing at all.

In FIGS. 11 and 12, the diaphragm 25 is suspended via springs 56, which have, for example, the shape shown in the top plan view of FIG. 12. In this way, the diaphragm 25 is very flexible, and the elastic force $F_e$ is considerably reduced. Further, also the deformation of the diaphragm 25 is modified, since it concentrates mainly at the springs 56. It follows that the diaphragm 25 is able to have a greater excursion. That is, it is possible to have greater variations of gap w for a same stresses. This on the one hand increases the sensitivity of the device 1, when it operates as sensor, and on the other enables a greater range of action of the device 1, when it operates as an actuator.

When the insulating layer 55 is provided, this effect may be obtained by making corrugations 57 on the top side of the insulating layer 55, at the springs 56, as shown in the enlarged detail of FIG. 11. As an alternative or in addition, the corrugations 57 could be formed also on the top surface 23 of the second substrate 21, by simple removal by chemical etching.

In the detail of FIG. 11, a passivation layer 58 extends alongside the top magnetic region 27, and possibly also underneath it, for protection and insulation.

Figure 13:
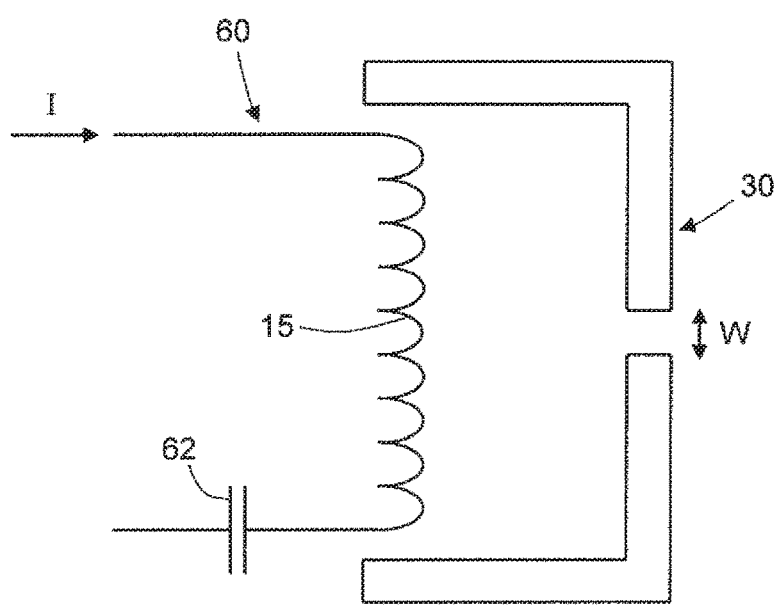
FIG. 13 shows a simplified electrical circuit that may be used for application as a pressure sensor.

FIG. 13 shows an example of a measuring circuit 60 that may be used for measuring the variations of inductance L of the magnetic circuit 30, in an application of the device 1 as a pressure sensor.

The measuring circuit 60 is formed basically by a resonant stage (which is formed as an LC series circuit, but may be formed also as an LC parallel circuit), including a capacitor 62 and the coil 15, and is then coupled to the magnetic circuit 30. The measuring circuit 60 has a resonance frequency f of:

$$f = 1/\sqrt{L_T C}$$

where $L_T$ is the total inductance, which depends upon the magnetic circuit 30, and in particular upon the gap w, and C is the capacitance of the capacitor 62.

Since, at the resonance frequency f, the measuring circuit 60 behaves as a short circuit, even small variations of the gap w and thus of the inductance $L_T$ of the magnetic circuit 30 cause sensible variations of the resonance frequency f, which may be detected in a known way. In particular, by supplying a measuring current $I_m$ of a sinusoidal type having a variable frequency, it is possible to determine the resonance frequency f by measuring the voltage across the measuring circuit 60, thus detecting the variations of the gap w.

Figure 14:
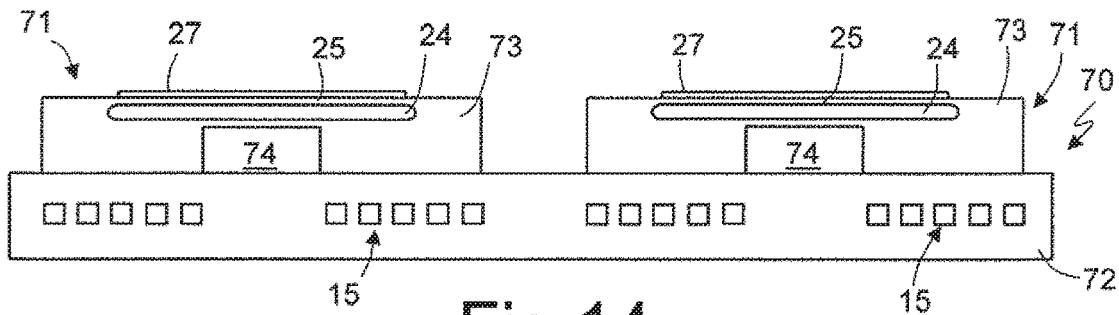
FIG. 14 show a cross-section of another embodiment of the present integrated device, operating as an actuator.

FIG. 14 shows an embodiment of the device operating as an actuator and in particular as a speaker. In the example, the embodiment shows a multipixel speaker 70, two pixels whereof are visible in the figure. It is understood, however, that the multipixel speaker device 70 comprises a plurality of pixels 71, and that the overall size depends upon the audio frequency band and the intensity that it is desired to obtain. FIG. 14 shows only the mechanical part. The electronic part (not shown) may be formed separately and fixed separately to a board (not shown), to which the mechanical part is fixed and on which the electrical connections (not shown) between the coil 15 and the electronic part (not shown) may be formed in a known way.

Each pixel 71 of the multipixel speaker 70 of FIG. 14 comprises an own single die 73 accommodating a respective magnetic via 74 (similar to the magnetic via 18 of FIG. 1), an own buried cavity 24, an own diaphragm 25, and an own top magnetic region 27. The second dice 73 are arranged alongside and fixed to a single insulating region 72. Alternatively, it is possible to have an insulating region 72 for each pixel 71. Each pixel 71 further comprises an own coil 15, which surrounds (in top plan view) the respective magnetic via 74. The magnetic vias 74 extend only through the respective die 73 and not through the insulating region 72, and the coils 15 are formed in the single insulating region 72.

In the multipixel speaker 70, since the second magnetic regions 27 are of soft ferromagnetic material, they may undergo just an attraction action towards the respective magnetic via 27.

Figure 15:
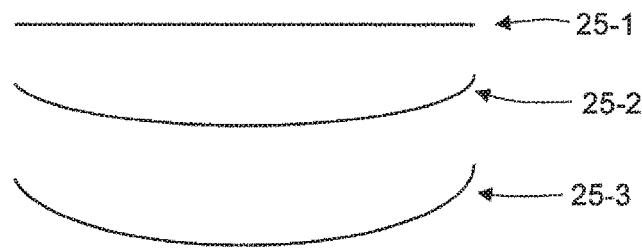
FIG. 15 is a schematic illustration of the behavior of the diaphragm in the device of FIG. 14.

Thus, in order to control the diaphragms 25 in a traditional way for speakers and enable the diaphragm 25 to perform movements in both directions with respect to a zero point. The coils 15 are supplied with a biasing current that causes deflection of the diaphragm to one half of its possible excursion. This deflection is defined as reference or zero position, designated by 25-1 in FIG. 15. Then, according to whether the diaphragm 25 of one pixel 71 is to be deflected in a first direction or a second direction that are opposite to one another (top position 25-2 or bottom position 25-3 in FIG. 15), the coil 15 is supplied with an appropriate current.

Each coil 15 may be supplied with a current I given by $I = I_{bias} + I_s$ where $I_{bias}$ is the d.c. biasing current, which causes attraction of the diaphragm 25 towards the magnetic via 74 and its deflection in the zero position. $I_s$ is a signal current, which causes the movement of the diaphragm upwards or downwards (top position 25-2 or bottom position 25-3).

In this way, the diaphragm 25 of each pixel 71 is able to perform a movement equivalent to that of at least one portion of a known speaker.

Using the same principle, it is possible to form speakers of different configurations.

Figure 16:
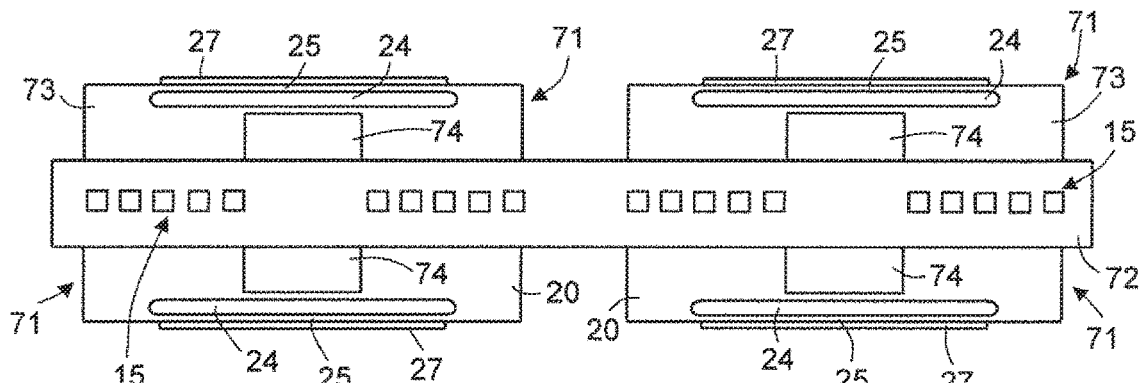
FIGS. 16-18 show cross-sections of other embodiments of the present integrated device.

For example, FIG. 16 shows an embodiment of a speaker having pixels 71 on both sides of the insulating region 72. In FIG. 16 four pixels are shown, arranged in twos on each side of the insulating region 72 and arranged vertically on top of each other. Here, the two pixels 71 arranged on top of one another share the same coil 15 so that they are controlled in the same way (i.e., the pixels 71 arranged on top of each other generate an identical acoustic wave).

Figure 17:
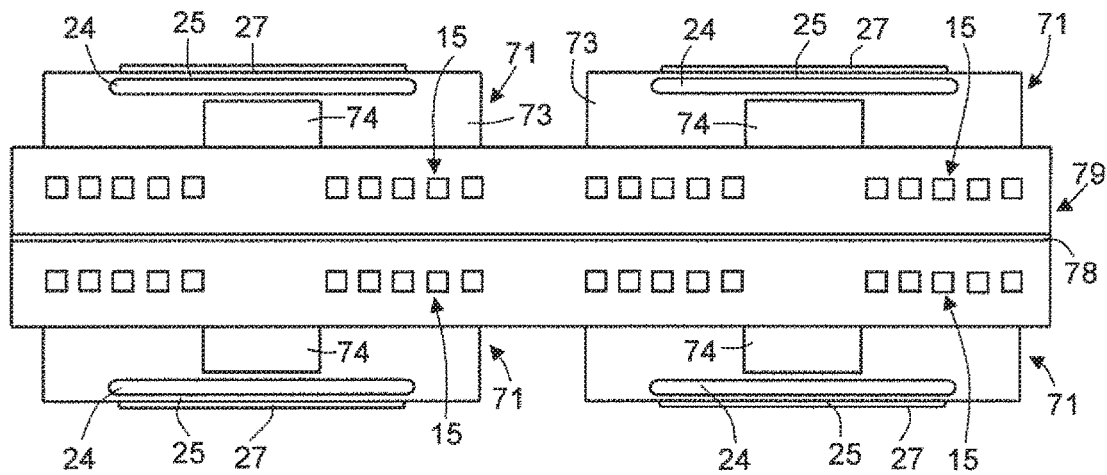

In the embodiment of FIG. 17, the pixels 71 vertically arranged on top of each other are uncoupled, since each pixel 71 is controlled by a respective coil 15, and a decoupling layer 78 extends within the insulating region 79 between coils 15 arranged on top of each other. For example, the decoupling layer 78 may be a layer of NiFe, ferrite, or CoZrTa, FeHfN and forms a magnetic shield that minimizes the cross-talk between the pixels arranged on top of each other.

Figure 18:
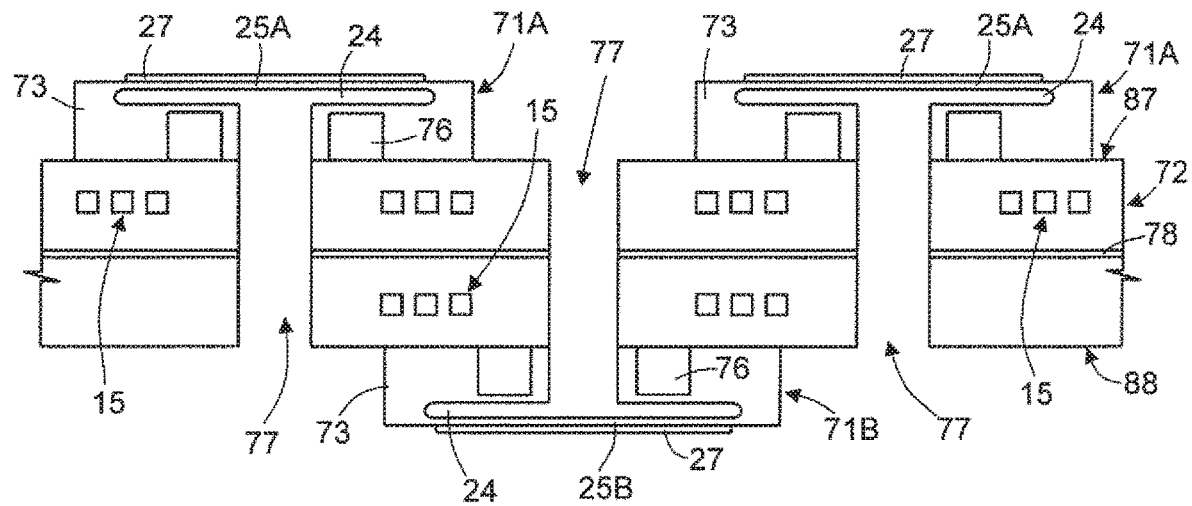

FIG. 18 shows an embodiment of a multipixel speaker wherein the pixels 71A, 71B are provided and arranged for simulating diaphragms that are mobile in opposite directions. In detail, in FIG. 19, the multipixel speaker comprises a first plurality of pixels 71A arranged on a first side 87 of the insulating region 72 and a second plurality of pixels 71B arranged on a second side 88 of the insulating region 79. The pixels 71A of the first plurality are further staggered with respect to the pixels 71B of the second plurality, in such a way that, notwithstanding the fact that the pixels 71A, 71B extend on both sides of the insulating region 79, on the back of each pixel 71A, 71B no other pixels are present.

Here, each pixel 71A, 71B comprises a magnetic via 76 of a toroidal shape arranged alongside a respective deep cavity 77 extending through the insulating region 79 and the respective second die 73. In particular, in the pixels 71A arranged on the first side 87 of the insulating region 79, the respective deep cavity 77 extends from the second side 88 of the insulating region 79 through the insulating region 79 and the respective die 73 as far as the respective buried cavity 24. In the pixels 71B arranged on the second side 88 of the insulating region 79, the respective deep cavity 77 extends from the first side 87 of the insulating region 79, through the insulating region 79 and the respective die 73, as far as the respective buried cavity 24. In this way, the buried cavities 24 are no longer insulated from the external environment and are exposed to the environmental conditions existing outside the device 1.

Also, each pixel 71 is controlled by a respective coil 15, and a decoupling layer 78 within the insulating region 79 reduces cross-talk.

Figure 19A:
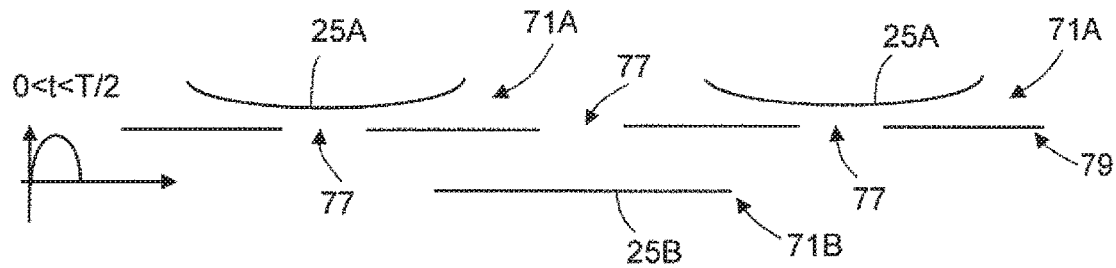
FIGS. 19A and 19B schematically show the behavior of the diaphragm in the device of FIG. 18.
Figure 19B:
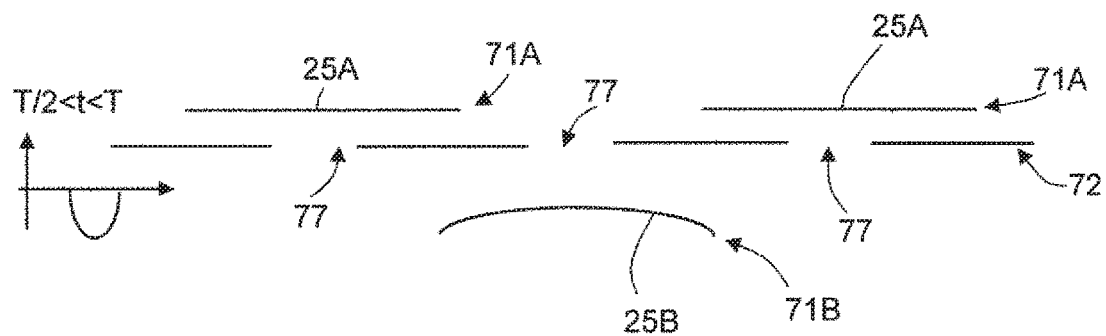

With this structure, the pixels 71A, 71B of the two pluralities of pixels may be actuated in different semiperiods of the signal. See, for example, FIGS. 19A, 19B which show schematically the position of the various diaphragms 25A, 25B of FIG. 18, in two semiperiods of the acoustic signal, formed by a sinusoid of period T. In particular, FIG. 19A shows the position of the diaphragms 25a, 25B in the first semiperiod (0<t<T/2), when the acoustic wave to be generated is to cause an expansion of the air over the device and a compression of the air underneath the device. In this step, the pixels 71A of the first plurality are actuated, the diaphragms 25A whereof deflect downwards (towards the insulating region 79), whereas the pixels 71B of the second plurality are not actuated, and the respective diaphragms 25B remain in a planar, undeformed, position (rest condition), as shown in FIG. 19A. Instead, in the second semiperiod (T/2<t<T), when the acoustic wave is to cause a compression in the air overlying the device, the pixels 71B of the second plurality are actuated, the diaphragms 25B whereof deflect upwards (towards the insulating region 79), whereas the pixels 71A of the first plurality are not actuated and the respective diaphragms 25A remain in the planar, undeformed, position (resting condition), as shown in FIG. 19B.

Figure 20:
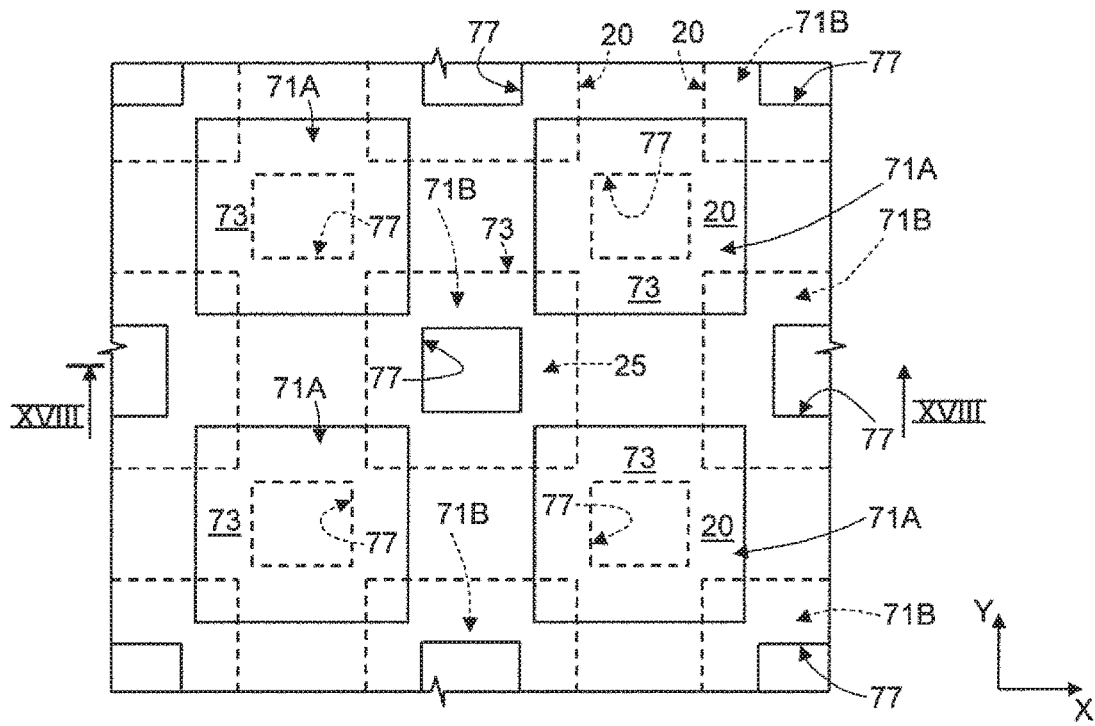
FIG. 20 is a top plan view of the device of FIG. 18.

This approach allows air expansion and compression and thus causes the oscillation to be symmetrical, using pixels 71 wherein each diaphragm 25 is actuated only in attraction towards the respective coil 15. FIG. 20 shows a possible layout for the multipixel speaker of FIG. 18 in which the pixels 71A, 71B of each plurality are aligned in rows and columns, to form two matrices or arrays and the two matrices are staggered both in direction X and in direction Y. In this way, the diaphragms 25A, 25B of the pixels 71A, 71B are not arranged on top of each other. In a further example, the two matrices may be staggered only in the direction X.

The two matrices may have dimensions and a number of pixels that depends upon the application and frequency of the sounds to be generated. For example, each pixel may have linear dimensions, for instance, ranging from 100 μm to 1 cm and beyond. The total size of the device may range from a few square millimetres (for example, 1-2 mm$^2$) to several tens of square centimeters (for example, 100 cm$^2$), according to whether it is desired to obtain a woofer, a sub-woofer, a mid-range, or a tweeter.

Embodiments are possible in which a single silicon die houses a number of pixels 71. The deep cavities 77 may be through or blind cavities passing through the die.

Figure 21:
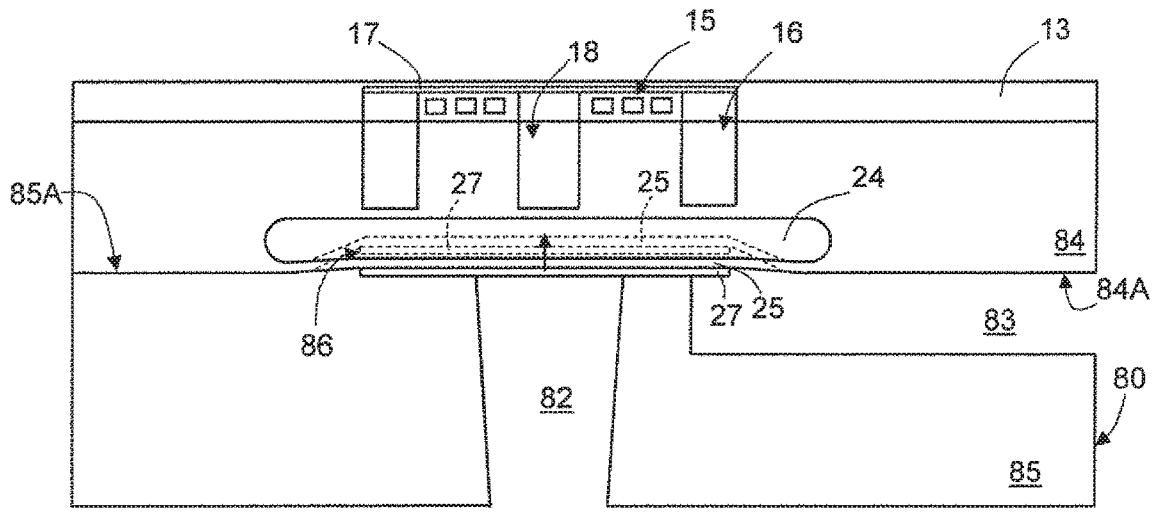
FIGS. 21-22 show cross-sections of other embodiments of the present integrated device.

FIG. 21 shows an embodiment of the device operating as an actuator, and in particular, as a valve in a microfluidic system. In the example shown, the microfluidic system comprises a body 80 of semiconductor material having a first access channel 82 and a second access channel 83, and the buried cavity 24 is arranged between the first and second access channels 82, 83. The diaphragm 25 extends over one side of the buried cavity 24 facing the access channels 82, 83 and is formed monolithically with the body 80. The top magnetic region 27 extends on a face of the diaphragm 25 and may be protected by at least one appropriate layer of a material, such as for example an oxide or a polymer, not shown for simplicity.

In the example shown, the body 80 is formed by a first and a second dice 84, 85 bonded together, the access channels 82, 83 are formed in the second die 85, and the buried cavity 24, as well as the diaphragm 25, are formed in the first die 84. The second die 85 has a face 85A bonded to the face 84A of the first die 84 that delimits the diaphragm 25.

Two magnetic vias 16, 18 extend within the first die 84 on one side of the buried cavity 24, opposite to the top magnetic region 27. The magnetic vias 16, 18 are formed in a way similar to the magnetic vias 16, 18 of FIGS. 1 and 2. A dielectric layer 13 covers the external surface of the first die 84, and the magnetic vias 16, 18 extend in part in the dielectric layer 13. As in FIGS. 1 and 2, the dielectric layer 13 houses a top magnetic region 17.

The buried cavity 24 defines a variable-volume chamber, depending upon the position of the diaphragm 25, as described hereinafter.

In the resting condition, i.e., when the coil 15 is not supplied or is supplied with a negligible biasing current, the diaphragm 25 is in contact with the surface 85A of the second die 85 and closes the inlet of the access channels 82, 83. In this condition, the access channels 82, 83 are isolated from each other, and there is no fluidic connection between them. The device is thus equivalent to a closed valve. Instead, by applying an excitation current to the coil 15 such as to cause deflection of the diaphragm 25, the latter moves away from the face 85A of the second die 85, thus freeing the inlet of the access channels 82, 83. In this condition, represented by dashed lines in FIG. 21, the variable-volume chamber in the buried cavity 24 is reduced in size, and underneath the diaphragm 25 a channel 86 is formed that fluidically connects the access channels 82, 83. By modulating the current flowing in the coil 15 it is possible to control the gap between the magnetic vias 16, 18 and the top magnetic region 17 and thus the section of the channel 86, thus regulating the flow of possible fluid between the access channels 82, 83.

In a way not shown, a first die 10 may be fixed to the dielectric layer 13 and integrate electronic control components.

Figure 22:
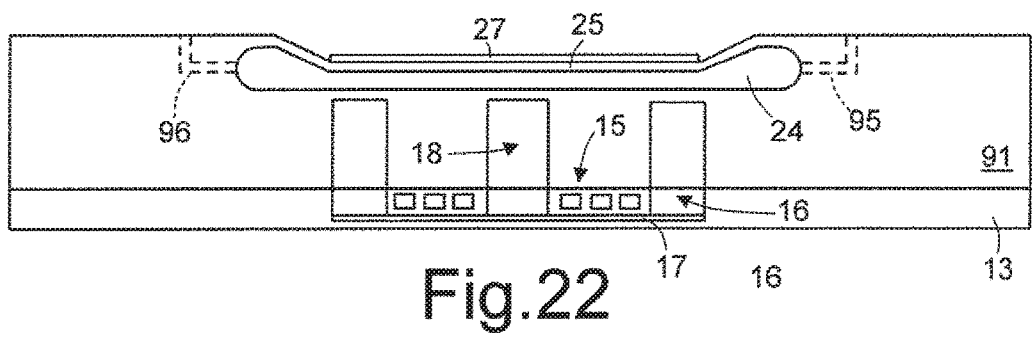

FIG. 22 shows an embodiment of the device operating as a pump. In this case, the device is formed in a die 91 of semiconductor material accommodating the buried cavity 24. Also, the buried cavity 24 defines the diaphragm 25 and forms a variable-volume chamber. The top magnetic region 27 extends over the diaphragm 25. The device further comprises magnetic vias 16, 18, the coil 15, and the bottom magnetic region 17.

The buried cavity 24 may be, for example, a portion of a fluidic channel with two access channels 95, 96, which are shown only schematically and terminate at opposite ends of the buried cavity 24.

In FIG. 22, the deflection movement of the diaphragm 25 moving from and to the magnetic vias 16, 18, controlled via the current supplied to the coil 15, causes variation of the volume of the variable-volume chamber in the buried cavity 24. This movement may be exploited for generating a suction pad action and cause, in a first step, intake of a fluid present in one of the two access channels, for example in the first access channel 95, towards the inside of the buried chamber 92, and, in a second step, its injection towards the other access channel, for example towards the second access channel 96. A purposely provided valve system inside or at one end of the access channels 95, 96 enables regulation of the flow of the fluid in the desired direction. For example, a pair of valves similar to the valve of FIG. 22 could enable fluidic control in the pump simultaneously with the valves.

As an alternative to what it shown, a single access channel could be provided, and this constitutes, respectively, an inlet channel or an outlet channel in separate pumping steps.

Finally, it is clear that modifications and variations may be made to the device described and illustrated herein, without thereby departing from the scope of the present invention, as defined in the annexed claims.

For example, in all the embodiments having an external magnetic via 16 of a generically toroidal shape, the latter, instead of being continuous, could be interrupted by gaps for reducing the eddy currents.

The top part of the magnetic vias 16, 18, 40, 41, 74, 76, within the top die 20, 73, 85, 91, instead of being full, could be formed via a thin ferromagnetic layer, as shown for example in FIG. 11, whereas the bottom part within the dielectric layer 13 could be formed as shown in FIG. 1. Alternatively, the top part of the magnetic vias 16, 18, 40, 41, 74, 76, within the second die 20, 73, 85, 91 could be full, and just the bottom part in the dielectric layer 13 could be formed via a thin ferromagnetic layer, as shown in FIG. 11.

The specific embodiment of the magnetic vias, the presence of the bottom magnetic region 17, the arrangement and shape of the coil 15, and possibly the presence, arrangement, shape, and connection of the second coil may vary in the various embodiments shown and the details may be replaced by other equivalent details described in different embodiments. For example, in the embodiment as actuator, the device of FIG. 21 or 22 may have one or two magnetic vias, one or two magnetic regions, one or two coils, etc.

Further, the embodiments of FIGS. 1-13 may be used both as sensors and as actuators. The springs 56 and the insulating layer 55 may be provided for also in other embodiments described herein. The multipixel architecture shown in FIGS. 14-18 may also be applied to the device 1 when used as a sensor and in the various embodiments shown

What is claimed is:

1. A method for making an integrated micro-electromechanical device, the method comprising:
    providing a first body comprising a semiconductor material having a first face and a second face opposite the first face,
    forming a diaphragm in the first body, the diaphragm being delimited between a buried cavity and the first face, wherein the diaphragm and interior surfaces of the buried cavity are each made of the semiconductor material;
    forming a first magnetic via extending between the second face and the buried cavity of the first body, the first magnetic via being separate from and below the buried cavity;
    forming a first magnetic region extending over the first face of the first body;
    forming a first coil extending over the second face of the first body and being magnetically coupled to the first magnetic via; and
    forming an insulating region including the first coil, the insulating region extending over the second face of the first body.

2. The method according to claim 1, wherein the first magnetic region and the first magnetic via each comprises a ferromagnetic material.

3. The method according to claim 1, further comprising forming a second magnetic via having a toroidal shape extending in the first body and forming, together with the first magnetic via and with the first magnetic region, a magnetic circuit.

4. The method according to claim 1, wherein the insulating region comprises magnetic portions extending therein; and further comprising forming a second magnetic region in contact with the insulating region and in contact with the first magnetic via by way of the magnetic portions.

5. The method according to claim 4, further comprising forming a second magnetic via extending in the first body, alongside the first magnetic via, wherein the first and second magnetic vias have a columnar shape and have a respective first end extending in the insulating region and in contact with the second magnetic region.

6. A method for making an integrated micro-electromechanical device comprising:
    forming a first body comprising a semiconductor material having a first face and a second face opposite the first face, the first body including a buried cavity forming a diaphragm made of the semiconductor material delimited between the buried cavity and the first face, with the diaphragm being monolithic with the first body;
    forming at least one first magnetic via extending within the first body between the second face and the buried cavity;
    forming a first magnetic region extending over the first face of the first body;
    forming a first coil extending over the second face of the first body and being magnetically coupled to the first magnetic via; and
    forming an insulating region extending over the second face of the first body and including the first coil therein.

7. The method according to claim 6, wherein the first magnetic region and the first magnetic via each comprises a ferromagnetic material.

8. The method according to claim 6, further comprising forming a second magnetic via having a toroidal shape extending in the first body and forming, together with the first magnetic via and with the first magnetic region, a magnetic circuit.

9. The method according to claim 6, wherein the at least one first magnetic via is separate from and entirely below the buried cavity.

10. The method according to claim 6, wherein the insulating region comprises magnetic portions extending therein; and further comprising forming a second magnetic region in contact with the insulating region and in contact with the first magnetic via by way of the magnetic portions.

11. The method according to claim 10, further comprising forming a second magnetic via extending in the first body, alongside the first magnetic via, wherein the first and second magnetic vias have a columnar shape and have a respective first end extending in the insulating region and in contact with the second magnetic region.

12. A method of operating an integrated micro-electromechanical device, the method comprising:
    supplying a first coil with an electrical current, the first coil being magnetically coupled to a first magnetic via within a first body of semiconductor material, wherein the first coil extends over a first face of the first body, and wherein the first magnetic via extends between the first face and a buried cavity of the first body, the first magnetic via during operation being physically separated from the buried cavity by a portion of the first body and all of the first magnetic via being located below the buried cavity;
    generating an attractive magnetic force between the first magnetic via and a first magnetic region using the electrical current in the first coil, wherein the first magnetic region extends over a second face of the first body, and wherein the second face is opposite the first face; and
    deflecting a diaphragm of the first body, the diaphragm being delimited between the buried cavity and the second face, wherein the diaphragm and interior surfaces of the buried cavity are each made of the semiconductor material.

13. The method according to claim 12, wherein the first magnetic region and the first magnetic via each comprises a ferromagnetic material.

14. The method according to claim 12, further comprising:
    generating a magnetic field in the first magnetic via and a second magnetic via using the electrical current in the first coil, wherein
    the second magnetic via has a toroidal shape and extends between the first face and the buried cavity of the first body, and
    the first magnetic via, the second magnetic via, and the first magnetic region are a magnetic circuit.

15. The method according to claim 12, wherein deflecting the diaphragm of the first body comprises:
    deflecting the diaphragm using the attractive magnetic force according to a signal comprising the electrical current.

16. The method according to claim 15, wherein the integrated micro-electromechanical device is a speaker.

17. The method according to claim 12, further comprising:
    monitoring a voltage drop across the first coil; and
    measuring an external force according to the voltage drop, wherein deflecting the diaphragm comprises deflecting the diaphragm using the external force.

18. The method according to claim 17, wherein the integrated micro-electromechanical device is a pressure sensor.

19. The method according to claim 12, further comprising:
    generating a magnetic field in the first magnetic via and a second magnetic via using the electrical current in the first coil, wherein
    the first magnetic via and the second magnetic via each have a columnar shape,
    the second magnetic via extends between the first face and the buried cavity of the first body, and
    the first magnetic via, the second magnetic via, and the first magnetic region are a magnetic circuit.

20. The method according to claim 19, wherein supplying the first coil with the electrical current further comprises:
    supplying a second coil with the electrical current, wherein
    the first coil surrounds the first magnetic via,
    the second coil extends over the first face of the first body, and
    the second coil surrounds the second magnetic via.

* * * * *